United States Patent [19]

Merenda

[11] Patent Number: 5,942,950
[45] Date of Patent: Aug. 24, 1999

[54] VARACTOR TUNED STRIP LINE RESONATOR AND VCO USING SAME

[75] Inventor: Joseph Leonard Merenda, Massapequa, N.Y.

[73] Assignee: AIL Systems, Inc., Deer Park, N.Y.

[21] Appl. No.: 09/075,649

[22] Filed: May 11, 1998

Related U.S. Application Data

[60] Provisional application No. 60/046,203, May 12, 1997.

[51] Int. Cl.$^6$ .............................. H03B 5/18; H03H 5/12

[52] U.S. Cl. .................. 331/99; 331/117 D; 331/177 V; 333/235

[58] Field of Search ..................... 331/96, 99, 107 SL, 331/117 R, 117 D, 117 V; 333/221, 223, 235, 238, 246, 247

[56] References Cited

U.S. PATENT DOCUMENTS 4,619,001  10/1986  Kane ........................................ 331/99

*Primary Examiner*—Siegfried H. Grimm
*Attorney, Agent, or Firm*—Hoffman & Baron, LLP

[57] ABSTRACT

A low noise wide tuning bandwidth voltage controlled oscillator employs a resonator circuit formed from at least two microstrip lines which are electromagnetically coupled to one another. Each of the microstrip lines has one end electrically coupled to circuit ground to provide a substantially inductive resonator circuit which is substantially immune to parasitic end effects and radiation loses. The frequency of the voltage controlled oscillator circuit is controlled by a variable capacitance varactor circuit coupled to at least one of the microstrip transmission lines. The resonator circuit is well suited for use with a bipolar transistor configured as a negative resistance oscillator.

4 Claims, 3 Drawing Sheets

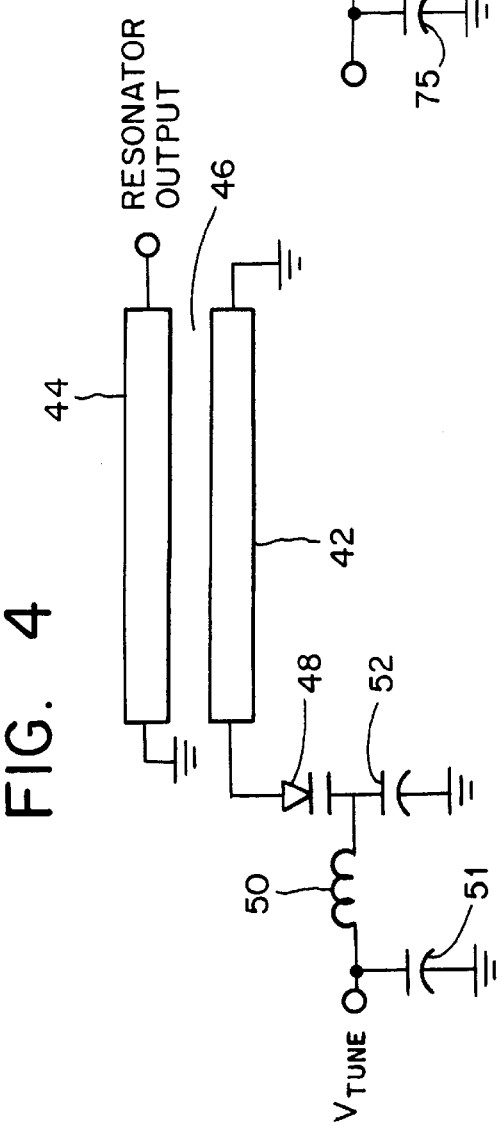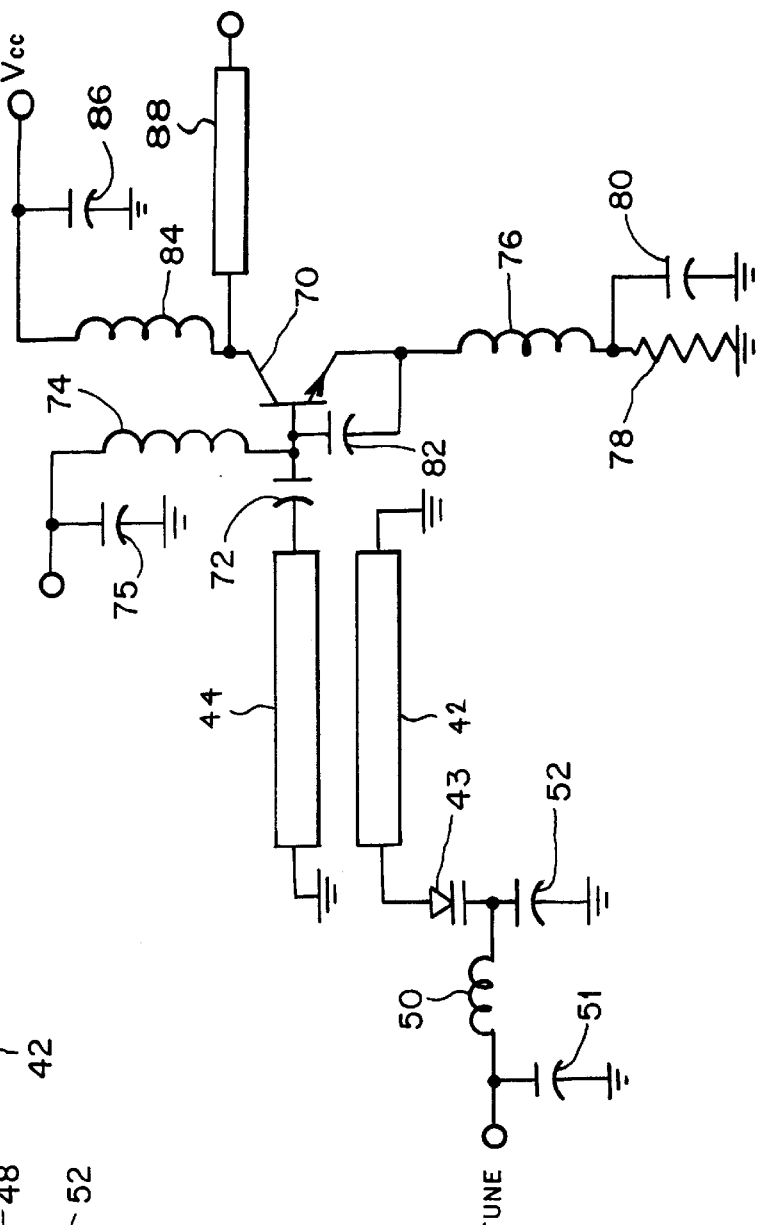

VARACTOR TUNED STRIP LINE RESONATOR AND VCO USING SAME

This application claims the benefit of U.S. Provisional Patent Application, Ser. No. 60/046,203 entitled "VCO Having Low Noise and Wide Tuning Range and Resonator for Same," filed on May 12, 1997.

BACKGROUND OF THE INVENTION

1. Field of the Invention

The present invention relates generally to electronic oscillator circuits and more particularly relates to a voltage controlled oscillator circuit having both low phase noise and wide tuning bandwidth.

2. Description of the Prior Art

Oscillator circuits, including voltage controlled oscillator circuits, are well known in the prior art. Typically, an oscillator circuit includes at least one active device and a resonator circuit coupled to the active device. The resonator is coupled to the active device such that the active device is capable of oscillating only at a specific frequency determined by the resonator. This results in a signal being generated at the frequency which satisfies the oscillation conditions.

In a voltage controlled oscillator (VCO), the frequency of oscillation is controlled by electronically altering the point of resonance of the resonator circuit. Typically, a variable resonator circuit includes at least one variable capacitance diode (varactor). The frequency of operation is set by applying a bias voltage to the varactor to alter the capacitance of the varactor diode. This change in capacitance alters the net reactance of the resonator and alters the frequency of operation of the oscillator circuit.

FIG. 1 illustrates a first resonator circuit which is known in the prior art. This conventional resonator circuit includes a series inductor 10, a series capacitor 12 and a series varactor 14. The anode of the varactor 14 is grounded and the cathode of the varactor 14 receives a bias voltage through an isolation inductor 16. Typically, a bypass capacitor 18 is included in conjunction with isolation inductor 16 to prevent RF energy appearing at the junction between varactor 14 and capacitor 12 ($C_{12}$ in the equation below) from being loaded by the $V_{TUNE}$ circuitry. As the bias voltage is varied, the capacitance of the varactor 14 also varies. The frequency of oscillation is dependent on the reactance of the circuit $X_R$ which may be stated as:

$$X_R = 2\pi FL - \frac{1}{2\pi FC}, \text{ and}$$

$$C = \frac{C_{12} \cdot C_{VARACTOR}}{C_{12} + C_{VARACTOR}}$$

where L is the inductance value of the inductor 10 and C is the total capacitance of the resonant circuit. As the above equations illustrate, varying the capacitance of varactor 14 ($C_{VARACTOR}$ in the equation above) effectively varies the frequency of resonance of the series circuit.

FIG. 2 illustrates an alternate topology of a resonator circuit known in the prior art. The embodiment of FIG. 2 employs a microstrip line 20 in place of the inductor 10 employed in FIG. 1. This resonator topology provides reasonable noise performance. However, this topology generally suffers from a limited tuning bandwidth of approximately 10%. For a wider tuning bandwidth, the circuit "quality factor" (Q) must be reduced, which in turn degrades noise performance. Therefore, this resonator embodiment requires the selection of either good noise performance or wide tuning bandwidth performance.

FIG. 3 illustrates a resonator circuit known in the prior art which employs open circuit configured coupled microstrip transmission lines. This circuit topology, which is discussed in an article entitled "Noise Calculations and Experimental Results of Varactor Tunable Oscillators with Significantly Reduced Phase Noise", by Güingerich et al., IEEE Transactions on Microwave Theory and Techniques, Vol. 43, No. 2, February 1995, provides broader tuning bandwidth than the single transmission line topology illustrated in FIG. 2. Referring to FIG. 3, this resonator configuration includes a pair of coupled lines 30, 32 separated by a narrow gap. A varactor 14 is electrically connected to one end of a first transmission line 30. The second end of the first transmission line 30 is left in an open circuit configuration, i.e., unconnected. The second transmission line 32 is electromagnetically coupled to the first transmission line 30 as a result of close proximity and parallel arrangement of the lines 30, 32. A first end of the second transmission line 32, which is proximate to the end of the first transmission line 30 connected to the varactor 14, may be connected to a source of bias voltage through a high impedance inductance 34 used to bias the base of a bipolar transistor. The second end of the second transmission line 32 forms the resonator output which is coupled to an oscillator circuit.

This topology suffers from several drawbacks because the transmission lines 30, 32 are connected in an open circuit configuration. This resonator topology suffers from high sensitivity to parasitic loading and radiator loss effects. Further, this resonator structure tends to be inherently capacitive, rather than inductive. In many high frequency oscillator circuits, such as negative resistance oscillators, an inductive resonator is required. Therefore, additional inductive reactance must be added to this resonator topology or the length of the resonator increased. This added length increases the resonator loss and degrades the noise performance of the resulting oscillator.

While various oscillator and resonator topologies are known in the art, there remains a need to provide a resonator circuit and voltage controlled oscillator circuit which provide both wide tuning bandwidth and low noise performance.

OBJECTS AND SUMMARY OF THE INVENTION

It is an object of the present invention to provide a voltage controlled oscillator circuit having both low phase noise and wide tuning bandwidth.

It is another object of the present invention to provide a voltage controlled oscillator circuit with low phase noise and high tuning bandwidth which employs a low cost resonator circuit.

It is yet another object of the present invention to provide a voltage controlled oscillator circuit having low phase noise and wide tuning bandwidth which employs an inductive microstrip resonator circuit.

It is a further object of the present invention to provide an improved resonator circuit for a voltage controlled oscillator which is less susceptible to printed circuit board manufacturing tolerances than inductive resonators of the prior art.

It is still a further object of the present invention to provide an inductive microstrip resonator for a voltage controlled oscillator which is both low cost and highly manufacturable.

It is yet another object of the present invention to provide a voltage controlled oscillator circuit which has a tuning bandwidth greater than 25% and phase noise less than −105 dBc/Hz at 100 kHz offset from the carrier frequency.

In accordance with one form of the present invention, a resonator circuit for a voltage controlled oscillator is formed with two coupled, short circuited transmission lines. The first and second transmission line each have a first end, a second end, a length and a width associated therewith. The first end of the first transmission line is in series with an electrically variable capacitance circuit. The second end of the first transmission line is electrically coupled to circuit ground. The second transmission line is electromagnetically coupled to the first transmission line by substantially parallel placement proximate the first transmission line. The first end of the second transmission line, which is proximate to the first end of the first transmission line, is electrically connected to circuit ground. The second end of the second transmission line forms a resonator output port.

In accordance with an alternate embodiment of the present invention, a second electrically variable capacitance circuit is added to the circuit previously described. The second variable capacitance circuit is coupled to the second end of the second transmission line, in series with the resonator output port. The first and second variable capacitance circuits cooperate to alter the resonator frequency of the resonator circuit.

As a result of the short circuited transmission line topology of the coupled microstrip resonator of the present invention, an inductive resonator circuit is formed wherein the transmission line widths are substantially wider than those used to facilitate inductive resonators known in the prior art. The wider transmission lines provide an advantage in manufacturing in that these lines are more repeatable and less susceptible to printed circuit board etching tolerances during manufacture.

In accordance with another form of the present invention, a voltage controlled oscillator is formed using a short circuited, coupled line microstrip resonator. The resonator is formed as previously described, having two parallel microstrip lines electromagnetically coupled to one another. A first end of the first microstrip line is in series with a varactor circuit which has a capacitance which varies in response to an applied bias voltage. The resonator output is electrically coupled to an active device stage which is configured as a negative resistance oscillator. The resonator circuit and active circuit cooperate to form a variable frequency oscillator whose frequency of operation is proportional to the applied bias voltage. The voltage controlled oscillator thus formed in accordance with the present invention achieves tuning bandwidth in excess of 25% and phase noise of less than −105 dBc/Hz at 100 kHz offset from the carrier.

Previously, microstrip resonator oscillators could achieve either low noise performance or wide tuning bandwidth. The combination of tuning bandwidth in excess of 25% with noise bandwidth of less than −105 dBc/Hz at 100 kHz from the carrier have not previously been attained.

These and other objects, features and advantages of the present invention will become apparent in the following detailed description of illustrative embodiments thereof, which is to be read in connection with the accompanying drawings.

BRIEF DESCRIPTION OF THE DRAWINGS

FIG. 4 is a schematic diagram of a short circuited, coupled microstrip transmission line resonator circuit formed in accordance with the present invention.

FIG. 6 is a schematic diagram of an exemplary voltage controlled oscillator formed in accordance with the present invention.

DETAILED DESCRIPTION OF THE PREFERRED EMBODIMENTS

Figure 1:
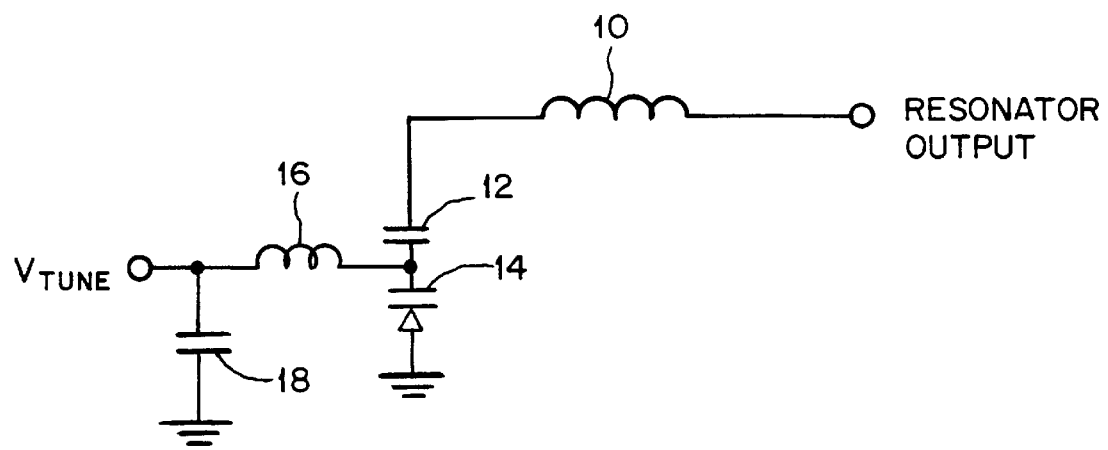
FIG. 1 is a schematic diagram of a series resonator circuit known in the prior art.
Figure 2:
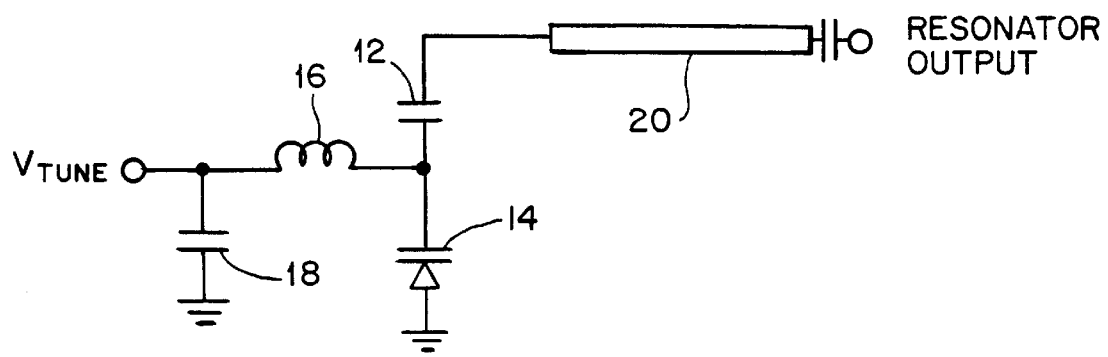
FIG. 2 is a schematic diagram of a microstrip transmission line resonator circuit for use with a voltage controlled oscillator, known in the prior art.
Figure 3:
FIG. 3 is a schematic diagram of an open circuit, coupled microstrip transmission line resonator, suitable for use in a voltage controlled oscillator circuit, known in the prior art.

FIG. 4 is a schematic diagram of a short circuited, coupled microstrip transmission line resonator circuit formed in accordance with the present invention. The resonator circuit includes at least a first transmission line 42 and a second transmission line 44 aligned in a substantially parallel arrangement with one another with a small gap 46 separating the first transmission line 42 from the second transmission line 44. In this fashion, the first and second transmission lines are electromagnetically coupled to each other.

The first transmission line 42 and second transmission line 44 each have a first end, a second end, a length and a width associated therewith. The first end of the first transmission line 42 is in series with an electrically variable capacitance circuit. The second end of the first transmission line 42 is electrically coupled to circuit ground. The first end of the second transmission line 44, which is proximate the first end of the first transmission line 42, is electrically connected to circuit ground. The second end of the second transmission line 44 forms a resonator output port.

Preferably, the first transmission line 42 and second transmission line 44 take the form of microstrip transmission lines. Microstrip transmission lines are generally formed on a printed circuit board laminate having at least a first copper layer and a second copper layer separated by a dielectric layer. The design and fabrication of microstrip transmission lines is well known in the art of microwave circuit design. The characteristics of a microstrip transmission line are dependent on the length of the line, the width of the line, the thickness of a dielectric material and the dielectric constant of the dielectric material. For a given dielectric substrate, highly repeatable microstrip transmission lines are formed by etching one copper layer of the printed circuit board to a specific length and width while leaving a second, opposing copper layer, substantially intact as a ground plane.

The first transmission line 42 and second transmission line 44 are of substantially equal length. Preferably, the length is selected to be slightly shorter than a quarter wave length ($\lambda/4$) at the desired frequency of operation. In this configuration, the resonator circuit presents an inductive reactance and the resonant frequency can be adjusted by the addition of capacitance. For a resonator designed to operate at a frequency of about 5 GHz, a length of approximately 0.35 inches is suitable, when fabricated on a 0.020 inch thick substrate of dielectric constant equal to 2.94.

The width of the first transmission line 42 is generally substantially equal to the width of the second transmission line 44. This width, along with the spacing between the first transmission line 42 and the second transmission line 44, are selected to provide a desired characteristic impedance (Zo) and coupling factor (K). For a resonator designed with an impedance of 70 ohms, a K of −8 dB and operating at a frequency of about 5 GHz, the width of the transmission lines is about 0.020 inches and the spacing is about 0.0038 inches when fabricated on a 0.020 inch thick substrate of dielectric constant equal to 2.94.

The first end of the first microstrip transmission line 42 is electrically connected in series with a variable capacitance circuit. Preferably, the variable capacitance circuit receives an external tuning signal and changes capacitance proportionally. Several methods of forming a capacitance which varies with an applied bias voltage are known in the art and are suitable for practicing the present invention. A preferred variable capacitance circuit, which is illustrated in FIG. 4, includes a varactor diode 48 electrically coupled to an external variable bias voltage ($V_{TUNE}$) through an isolation inductor 50.

For resonator circuits designed to operate in the frequency region of 4.9 GHz to 6.3 GHz, it is preferable that varactor diode 48 is fabricated from silicon rather than Gallium Arsenide (Ga As). This is because Ga As devices tend to suffer from surface current leakage effects which can degrade noise performance. Preferably, the variable capacitance circuit includes a bypass capacitor 51 coupled from the $V_{TUNE}$ terminal to circuit ground. Bypass capacitor 51 is selected in conjunction with inductor 50 to prevent RF energy from being loaded by the $V_{TUNE}$ circuitry. The variable capacitance circuit further includes a shunt capacitor 52 electrically coupled from the junction of the isolation inductor 50 and varactor diode 48 to circuit ground. The total capacitance of the variable capacitance circuit is determined by the series combination of the varactor diode 48 and the shunt capacitance 52.

As the $V_{TUNE}$ bias voltage signal applied to the isolation inductor 50 is varied, the capacitance of the varactor diode 48 also varies. This results in a net change in capacitance and ultimately a net change in reactance of the resonator circuit. The short circuit resonator topology, with the second end of the first microstrip line 42 electrically connected to circuit ground, provides a return path for the bias voltage applied to the varactor diode 48.

Figure 5:
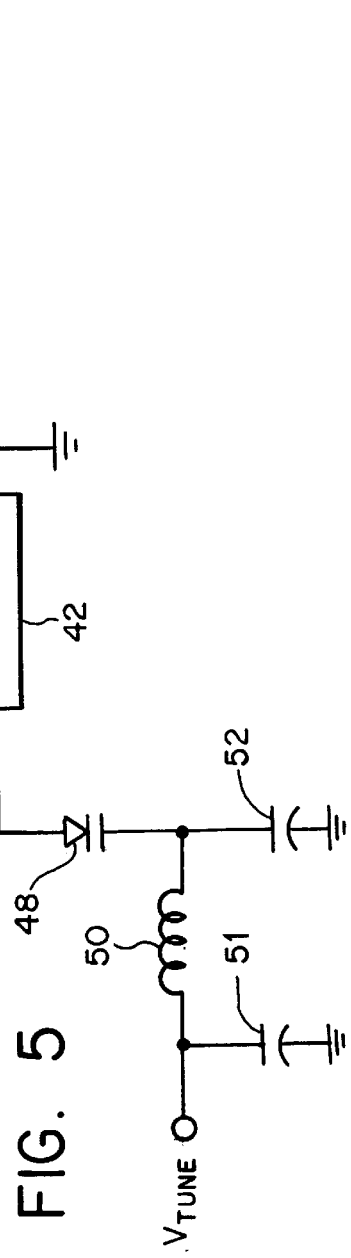
FIG. 5 is a schematic diagram of a short circuited, coupled microstrip transmission line resonator circuit employing dual tuning varactors, formed in accordance with the present invention.

FIG. 5 shows an alternate embodiment of a short circuited, coupled line resonator circuit formed in accordance with the present invention. The resonator circuit of FIG. 5 is substantially the same as that previously discussed in connection with FIG. 4, with the addition of a second variable capacitance circuit in series with the second end of the second transmission line 44. The second variable capacitance circuit includes a second varactor diode 60 having an anode connected to the second end of the second microstrip line 44 and a cathode electrically coupled to the tuning bias voltage through a second isolation inductor 62. A series capacitor 64 is electrically connected to the junction of the inductor 62 and varactor diode 60 with a second terminal forming a new resonator output port. Capacitor 64 acts as a blocking capacitor to the direct current $V_{TUNE}$ signal applied to the second varactor 60. A bypass capacitor 66 is connected to the second isolation inductor 62 at the point where the bias voltage is applied.

A voltage controlled oscillator (VCO) circuit employing the resonator circuit of FIG. 4 is illustrated in FIG. 6. The VCO circuit includes an active device with sufficient emitter feedback to function as an oscillator circuit. FIG. 6 illustrates an embodiment employing a bipolar transistor 70 functioning as the active device; however, other active elements such as field effect transistors can also be employed.

The resonator circuit of FIG. 6 is coupled to the transistor 70 through a series coupling capacitor 72 interposed between the base of the transistor 70 and the second end of the second transmission line 44. The series coupling capacitor 72 functions as a DC blocking capacitor to isolate the transistor bias voltage from circuit ground. The coupling capacitor 72 is preferably chosen with a value which presents a low impedance at the frequency of operation. The transistor 70 receives a base bias voltage through an inductor 74. The inductor 74 may be a lumped circuit element, or preferably, a printed high impedance microstrip line. Preferably, a bypass capacitor 75 is connected to the junction of the inductor 74 and the base bias voltage source and circuit ground. The inductor 74 provides a high impedance which isolates the base bias voltage source at the frequency of oscillation.

The exemplary VCO circuit illustrated in FIG. 6 further includes a second inductor 76 and resistor 78. The inductor 76 has a first terminal connected to the emitter of the transistor 70 and a second terminal connected to a first terminal of the resistor 78. A second terminal of the resistor 78 is connected to circuit ground to provide a DC return path for bias currents flowing through the transistor 70. A bypass capacitor 80 is connected in parallel with the resistor 78 and provides a low impedance path to circuit ground at the frequency of oscillation.

The VCO circuit further includes a feedback capacitor 82. The feedback capacitor 82 is electrically coupled from the base of transistor 70 to the emitter of transistor 70 and in conjuction with inductor 76, provides the necessary feedback to create a region of potential instability in the transistor 70 at the frequency of oscillation.

A third inductor 84 is interposed between a collector voltage source ($V_{cc}$) and the collector terminal of the transistor 70. The third inductor 84 provides a high impedance feed for the collector voltage source applied to transistor 70. Preferably, a bypass capacitor 86 is electrically coupled from the junction of $V_{cc}$ and inductor 84 to circuit ground.

The illustrative VCO circuit also includes an output transmission line 88. The transmission line 88 has a first terminal connected to the collector of transistor 70 and a second terminal which functions as an output terminal of the oscillator circuit. The VCO circuit thus described is configured as a negative resistance oscillator which, in the presence of an inductive reactance coupled to the base of transistor 70, will resonate at a selected frequency. The net inductive reactance of the resonator circuit is controlled by the $V_{TUNE}$ bias voltage which is applied to the varactor 48 through coupling inductor 50. A change in the applied $V_{TUNE}$ bias voltage signal effects a change in diode capacitance which in turn effects the net inductive reactance presented at the output port of the resonator circuit. This change in inductive reactance effectively steers the point of resonance of the negative resistance oscillator.

While the VCO is shown employing the resonator circuit of FIG. 4, it will be appreciated that the resonator circuit of FIG. 5, which includes a second variable capacitance circuit may also be employed. In the case of the dual varactor circuit, the $V_{TUNE}$ bias voltage signal is simultaneously applied to varactors 48 and 60 through corresponding isolation inductors 50 and 62.

It will be appreciated by those skilled in the art that the specific values of components and dimension of transmission lines may be varied while still achieving acceptable results. A method of design and analysis of oscillators may be found in the book entitled "Non-Linear Microwave Circuits" by Stephen A. Mass, pp. 449–469, Copyright 1988, Artech House, which is incorporated herein by reference.

A resonator circuit formed in accordance with the present invention provides both high Q and broad tuning capability, a combination which is traditionally not attainable. When coupled to a suitable oscillator circuit, a voltage controlled oscillator is formed that achieves a tuning bandwidth in excess of 25% while exhibiting phase noise less than −105 dBc/Hz at an offset of 100 kHz from the carrier frequency. These results are achieved with circuitry that is low cost, easily manufactured and provides repeatable results. Accordingly, a voltage controlled oscillator formed in accordance with the present invention overcomes several limitations previously encountered in the art of oscillator design.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A microstrip resonator circuit providing a variable resonance in response to an applied tuning signal, the resonator comprising:
   a variable capacitance circuit, the variable capacitance circuit providing a variable capacitance in response to the received tuning signal;
   a first microstrip line having a first end and a second end, the first end of the first microstrip line being coupled in series with the variable capacitance circuit, the second end of the first microstrip line being connected to a circuit ground potential; and
   a second microstrip line having a first end and a second end, the second microstrip line being aligned substantially parallel to the first microstrip line so as to be electromagnetically coupled to the first microstrip line and with the first end of the second microstrip line proximate the first end of the first microstrip line, the first end of the second microstrip line being connected to circuit ground potential, the second end of the second microstrip line being a resonator output terminal.

2. A microstrip resonator circuit as defined by claim 1, wherein the variable capacitance circuit comprises a first varactor diode in series with the first end of the first microstrip line.

3. A microstrip resonator circuit comprising:
   a first variable capacitance circuit, the first variable capacitance circuit comprising a first varactor diode, the first variable capacitance circuit providing a variable capacitance in response to a received tuning signal;
   a second variable capacitance circuit, the second variable capacitance circuit being coupled in series with a resonator output terminal;
   a first microstrip line having a first end and a second end, the first end of the first microstrip line being coupled in series with the first varactor diode of the first variable capacitance circuit, the second end of the first microstrip line being connected to a circuit ground potential; and
   a second microstrip line having a first end and a second end, the second microstrip line being aligned substantially parallel to the first microstrip line so as to be electromagnetically coupled to the first microstrip line and with the first end of the second microstrip line proximate the first end of the first microstrip line, the first end of the second microstrip line being connected to circuit ground potential, the second end of the second microstrip line being the resonator output terminal.

4. A voltage controlled oscillator circuit providing a variable frequency output signal in response to an applied tuning signal, the voltage controlled oscillator circuit comprising:
   an active oscillator circuit having a resonator input terminal and an oscillator output terminal, the active oscillator circuit generating the variable frequency output signal;
   a variable capacitance circuit, the variable capacitance circuit providing a variable capacitance value in response to the applied tuning signal;
   a first microstrip line having a first end and a second end, the first end of the first microstrip line being electrically connected in series with the variable capacitance circuit, the second end of the first microstrip line being connected to a circuit ground potential; and
   a second microstrip line having a first end and a second end, the second microstrip line being aligned substantially parallel to the first microstrip line so as to be electromagnetically coupled to the first microstrip line and with the first end of the second microstrip line proximate the first end of the first microstrip line, the first end of the second microstrip line being connected to the circuit ground potential, the second end of the second microstrip line being electrically coupled to the resonator input terminal of the active oscillator circuit.

* * * * *

UNITED STATES PATENT AND TRADEMARK OFFICE
CERTIFICATE OF CORRECTION

PATENT NO. : 5,942,950
DATED : August 24, 1999
INVENTOR(S) : Joseph Leonard Merenda It is certified that error appears in the above-identified patent and that said Letters Patent is hereby corrected as shown below:

In Column 8, line 8, "in series with" should be --to--;

In Column 8, line 11, "in" should be deleted; and

In Column 8, line 12, "series with" should be --to--.

Signed and Sealed this

Eighteenth Day of July, 2000

Attest:

Q. TODD DICKINSON

*Attesting Officer*  *Director of Patents and Trademarks*